(12) United States Patent
Kim et al.

(10) Patent No.: US 8,310,840 B2
(45) Date of Patent: *Nov. 13, 2012

(54) ELECTROMAGNETIC BANDGAP STRUCTURE AND PRINTED CIRCUIT BOARD

(75) Inventors: Han Kim, Yongin-si (KR); Je-Gwang Yoo, Yongin-si (KR); Chang-Sup Ryu, Yongin-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 695 days.

This patent is subject to a terminal disclaimer.

(21) Appl. No.: 12/222,057

(22) Filed: Jul. 31, 2008

(65) Prior Publication Data

US 2009/0038840 A1 Feb. 12, 2009

Related U.S. Application Data

(63) Continuation-in-part of application No. 12/010,561, filed on Jan. 25, 2008, now Pat. No. 8,169,780.

(30) Foreign Application Priority Data

Aug. 7, 2007 (KR) .................. 10-2007-0079261
Jun. 18, 2008 (KR) .................. 10-2008-0057462

(51) Int. Cl.
*H05K 7/00* (2006.01)
(52) U.S. Cl. ......... 361/782; 174/262; 174/264; 174/251
(58) Field of Classification Search .................. 174/264, 174/262, 251; 361/756, 782; 333/247, 246, 333/116
See application file for complete search history.

(56) References Cited

U.S. PATENT DOCUMENTS

| 5,610,569 | A | * | 3/1997 | Hwang et al. ............. 336/200 |
| 5,629,654 | A | | 5/1997 | Frick |
| 5,696,471 | A | | 12/1997 | Fujiwara |
| 5,978,231 | A | * | 11/1999 | Tohya et al. ............. 361/782 |
| 6,023,211 | A | * | 2/2000 | Somei ..................... 333/246 |
| 6,483,045 | B1 | | 11/2002 | Wang et al. |
| 6,696,910 | B2 | | 2/2004 | Nuytkens et al. |
| 6,806,793 | B2 | | 10/2004 | Bhatia et al. |
| 6,833,512 | B2 | * | 12/2004 | Liu ........................ 174/262 |
| 6,977,348 | B2 | | 12/2005 | Ho et al. |

(Continued)

FOREIGN PATENT DOCUMENTS

CN 1201363 12/1998

(Continued)

OTHER PUBLICATIONS

English Translation of the Chinese Office Action mailed Jan. 29, 2010 in corresponding Chinese Patent Application 200810145860.9

(Continued)

*Primary Examiner* — Tuan T Dinh
*Assistant Examiner* — Steven Sawyer

(57) ABSTRACT

Disclosed are an electromagnetic bandgap structure and a printed circuit board including the same. In accordance with an embodiment of the present invention, the printed circuit board can include a dielectric layer, a plurality of conductive plates, and a stitching via, which is configured to electrically connect the conductive plates to each other. The stitching via can pass through the dielectric layer, and a part of the stitching via can be placed in a planar surface that is different from a planar surface in which the conductive plates are placed. With the present invention, the electromagnetic bandgap structure can prevent a signal of a predetermined frequency band from being transferred.

23 Claims, 14 Drawing Sheets

U.S. PATENT DOCUMENTS

| | | | |
|---|---|---|---|
| 2004/0113721 | A1* | 6/2004 | Bhatia et al. .................. 333/175 |
| 2006/0076160 | A1 | 4/2006 | Hsu et al. |
| 2006/0152323 | A1 | 7/2006 | Pavier |
| 2007/0120223 | A1 | 5/2007 | McKinzie, III et al. |
| 2007/0289771 | A1 | 12/2007 | Osaka et al. |

FOREIGN PATENT DOCUMENTS

| | | |
|---|---|---|
| JP | 06-181389 | 6/1994 |
| JP | 10-209726 | 8/1998 |
| JP | 2000-165171 | 6/2000 |
| JP | 2004-032232 | 1/2004 |
| JP | 2004-32232 | 1/2004 |
| JP | 2007-5614 | 1/2007 |
| JP | 2007-035710 | 2/2007 |
| JP | 2007-104211 | 4/2007 |

OTHER PUBLICATIONS

U.S. Appl. No. 12/010,561, filed Jan. 25, 2008, Han Kim et al., Samsung Electro-Mechanics Co., Ltd.

Japanese Office Action issued May 18, 2010 in corresponding Japanese Patent Application 2008-044270.

Korean Office Action issued May 28, 2010 in corresponding Korean Patent Application 10-2008-0057462.

U.S. Patent Office Action, mailed Nov. 19, 2010, issued in corresponding U.S. Appl. No. 12/010,561.

Japanese Office Action issued Nov. 9, 2010 in corresponding Japanese Patent Application 2008-199568.

U.S. Patent Office Action mailed Apr. 21, 2011 in co-pending U.S. Appl. No. 12/010,561.

U.S. Patent Office Action mailed Aug. 23, 2011 in corresponding U.S. Appl. No. 12/010,561.

Taiwan Office Action dated Nov. 28, 2011 issued in corresponding Taiwan Patent Application No. 097129361.

Japanese Office Action issued Aug. 16, 2011 in corresponding Japanese Patent Application 2008-199568.

U.S. Notice of Allowance issued in copending U.S. Appl. No. 12/010,561 dated Feb. 1, 2012.

German Office Action mailed Apr. 12, 2012 issued in corresponding German Patent Application No. 10 2008 041 072.1.

Japanese Office Action mailed May 22, 2012 issued in corresponding Japanese Patent Application No. 2008-199568.

* cited by examiner

ELECTROMAGNETIC BANDGAP STRUCTURE AND PRINTED CIRCUIT BOARD

CROSS-REFERENCE TO RELATED APPLICATIONS

This application is a continuation-in-part of U.S. patent application No. Ser. No. 12/010,561, filed on Jan. 25, 2008 now U.S. Pat. No. 8,169,780. And this application claims the benefit of Korean Patent Application Nos. 10-2007-0079261 and 10-2008-0057462 filed with the Korean Intellectual Property Office on Aug. 7, 2007 and Jun. 18, 2008, the disclosure of which is incorporated herein by reference in its entirety.

BACKGROUND

1. Technical Field

The present invention relates to an electromagnetic bandgap structure, more specifically to an electromagnetic bandgap structure and a printed circuit board having the same that prevent a signal ranging a predetermined frequency band from being transferred.

2. Description of the Related Art

New electronic apparatuses and communication apparatuses are increasingly becoming smaller, thinner and lighter, reflecting today's emphasis on growing mobility.

These electronic and communication apparatuses have various complex electronic circuits (i.e. analog circuits and digital circuits) for performing their functions and operations. These electronic circuits typically carry out their functions by being implemented in a printed circuit board (PCB). The electronic circuits on the PCB commonly have different operation frequencies from one another.

The printed circuit board in which various electronic circuit boards are implemented often has a noise (i.e. mixed signal) problem, caused by the transfer and interference of an electromagnetic (EM) wave resulted from the operation frequency and its corresponding harmonics components of one electronic circuit to another electronic circuit. The transferred noise can be roughly classified into radiation noise and conduction noise.

The radiation noise can be easily prevented by covering a protective cap on the electronic circuit. However, preventing the conduction noise is not as easy, because the conduction noise is transferred through a signal transfer path inside the board.

The noise problem will be described in more detail with reference to FIG. 1. FIG. 1 is a sectional view showing a printed circuit board including two electronic circuits having different operation frequencies. Although FIG. 1 shows a 4-layered printed circuit board 100, it shall be obvious that the printed circuit board can be modified to have a 2-, 6- or 8-layered structure.

As shown in FIG. 1, the printed circuit board 100 includes metal layers 110-1, 110-2, 110-3 and 110-4 (hereinafter, collectively referred to as 110) and dielectric layers 120-1, 120-2 and 120-3 (hereinafter, collectively referred to as 120) interposed between the metal layers 110. The top metal layer 110-1 of the printed circuit board 100 is equipped with two electronic circuits 130 and 140 having different operation frequencies (hereinafter, referred to as a first electronic circuit 130 and a second electronic circuit 140, respectively). In a mobile communication apparatus, for example, such as a mobile phone, the two electronic circuits 130 and 140 having different operation frequencies can be a digital circuit, functioning as a micro processor, and an RF circuit (i.e. analog circuit), for receiving and transmitting an RF signal.

Here, if it is assumed that the metal layer represented by reference numeral 110-2 is a ground layer and the metal layer represented by reference numeral 110-3 is a power layer, each ground pin of the first electronic circuit 130 and the second electronic circuit 140 is electrically connected to the metal layer represented by reference numeral 110-2, and each power pin is electrically connected to the metal layer represented by reference numeral 110-3. In the printed circuit board 100, every ground layer is also electrically connected to each other through vias. Similarly, every power layer is also electrically connected to each other through vias (refer to the reference numeral 160 in FIG. 1).

If the first electronic circuit 130 and the second electronic circuit 140 have different operation frequencies, a conductive noise 150 caused by an operation frequency of the first electronic circuit 130 and its harmonics components is transferred to the second electronic circuit 140, as shown in FIG. 1. This has a disadvantageous effect on the accurate function/operation of the second electronic circuit 140.

With the growing complexity of electronic apparatuses and higher operation frequencies of digital circuits, it is increasingly more difficult to solve this conduction noise problem. Especially, the typical bypass capacitor method or decoupling capacitor method for solving the conductive noise problem is no longer adequate, as the electronic apparatuses use a higher frequency band.

Moreover, the aforementioned solutions are not adequate when several active devices and passive devices need to be implemented in a complex wiring board having various types of electronic circuits formed on the same board or in a narrow area such as a system in package (SiP) or when a high frequency band is required for the operation frequency, as in a network board.

SUMMARY

The present invention provides an electromagnetic bandgap structure and a printed circuit board having the same that decrease the noise of a particular frequency by having a compact size and a low bandgap frequency.

The present invention also provides an electromagnetic bandgap structure and a printed circuit board having the same that make it easy to design them by having a compact size and acquiring high impedance and high inductance in the case of applying a lot of active elements and passive elements to a narrow area such as a system in package (SiP).

In addition, the present invention provides an electromagnetic bandgap structure and a printed circuit board having the same that solves a mixed signal problem in an electronic apparatus (e.g. a mobile communication apparatus) including an RF circuit and a digital circuit which are placed at the same board.

An aspect of the present invention features an electromagnetic bandgap structure including a dielectric layer; a plurality of conductive plates; and a stitching via, configured to electrically connect the conductive plates to each other. At this time, the stitching via can pass through the dielectric layer, and a part of the stitching via can be placed in a planar surface that is different from a planar surface in which the conductive plates are placed.

Here, the stitching via can include a first via, passing through the dielectric layer and having an end part being connected to any one of two adjacent conductive plates; a second via, passing through the dielectric layer and having an end part being connected to the other of two adjacent conductive plates; and a connection pattern, having one end part being connected to the other end part of the first via and the other end part being connected to the other end part of the second via.

The electromagnetic band structure can further include a conductive layer, where the dielectric layer is placed between the conductive plates and the conductive layer. At this time, the conductive layer can include a clearance hole, and the connection pattern can be accommodated in the clearance hole.

The conductive plate can have a polygonal, circular or elliptical shape. The conductive plates can have the same size. Alternatively, the conductive plates can be distinguished into a plurality of groups having different conductive plate sizes. The conductive plates can also be placed on the same planar surface.

Another aspect of the present invention features a printed circuit board including two electronic circuits having different operation frequencies; and an electromagnetic bandgap structure, configured to include a dielectric layer, a plurality of conductive plates and a stitching via electrically connecting the conductive plates to each other and arranged between the two electronic circuits. At this time, the stitching via can pass through the dielectric layer, and a part of the stitching via can be placed in a planar surface that is different from a planar surface in which the conductive plates are placed.

Here, the stitching via can include a first via, passing through the dielectric layer and having an end part being connected to any one of two adjacent conductive plates; a second via, passing through the dielectric layer and having an end part being connected to the other of two adjacent conductive plates; and a connection pattern, having one end part being connected to the other end part of the first via and the other end part being connected to the other end part of the second via.

The printed circuit board can further include a conductive layer, where the dielectric layer can be placed between the conductive plates and the conductive layer. At this time, the conductive layer can include a clearance hole, and the connection pattern can be accommodated in the clearance hole.

The conductive layer can be one of a ground layer and a power layer, and the conductive plates can be connected on the same planar surface as a different layer. At this time, the conductive plates can be connected to the different layer through the stitching via.

Here, the conductive plate can have a polygonal, circular or elliptical shape. The conductive plates can have the same size. Alternatively, the conductive plates can be distinguished into a plurality of groups having different conductive plate sizes. The conductive plates can be also placed on the same planar surface.

Another aspect of the present invention features a printed circuit board including a signal layer; a ground layer; and an electromagnetic bandgap structure, configured to include a dielectric layer, a plurality of conductive plates and a stitching via electrically connecting the conductive plates to each other. At this time, the stitching via can pass through the dielectric layer, and a part of the stitching via can be placed in a planar surface that is different from a planar surface in which the conductive plates are placed, and the conductive plates can be connected on a same planar surface as a planar surface in which the signal layer is placed.

Here, the conductive plate can be connected to the signal layer through the stitching via.

The stitching via can include a first via, passing through the dielectric layer and having an end part being connected to any one of two adjacent conductive plates; a second via, passing through the dielectric layer and having an end part being connected to the other of two adjacent conductive plates; and a connection pattern, having one end part being connected to the other end part of the first via and the other end part being connected to the other end part of the second via.

The printed circuit board can further include a conductive layer, wherein the dielectric layer is placed between the conductive plates and the conductive layer. At this time, the conductive layer can include a clearance hole, and the connection pattern can be accommodated in the clearance hole. Here, the conductive layer can be a ground layer.

The conductive plate can have a polygonal, circular or elliptical shape. The conductive plates can have the same size. Alternatively, the conductive plates can be distinguished into a plurality of groups having different conductive plate sizes. The conductive plates can be placed on the same planar surface. The conductive plates can also be arranged along a signal transfer path in one row or two rows.

DETAILED DESCRIPTION

Figure 1:
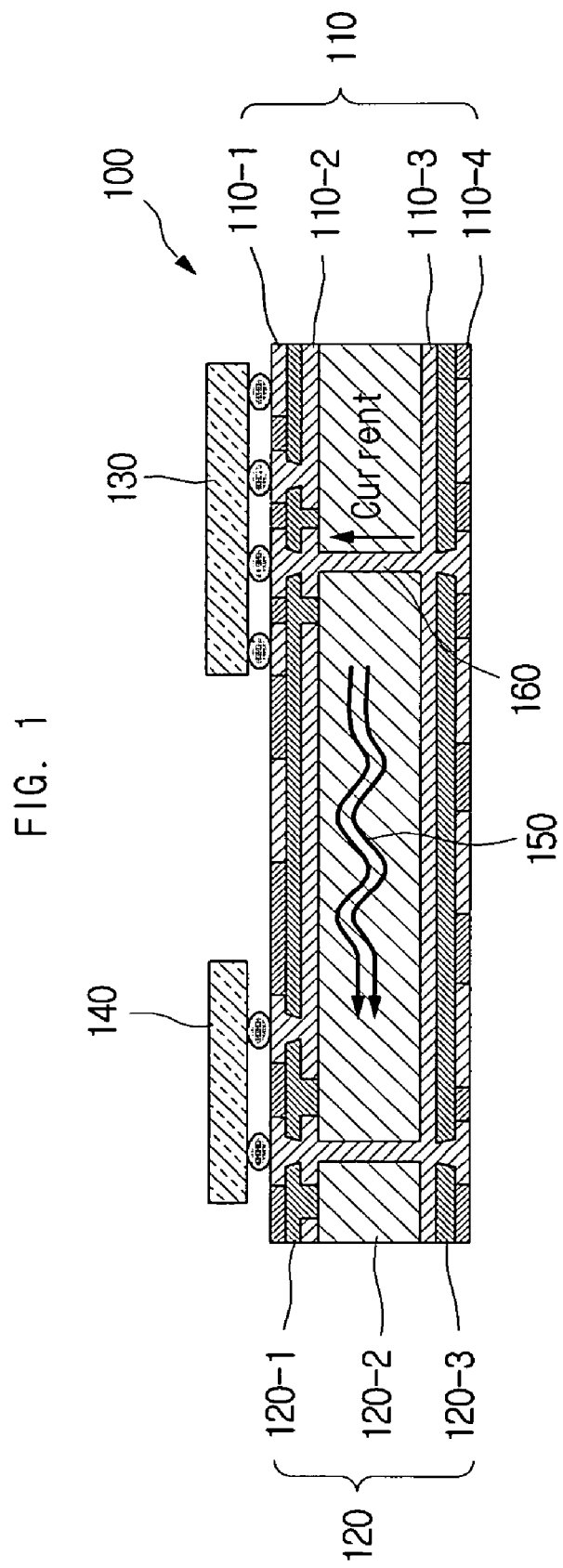
FIG. 1 is a sectional view showing a printed circuit board including an analog circuit and a digital circuit.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. Throughout the drawings, similar elements are given similar reference numerals. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other. For instance, the first element can be named the second element, and vice versa, without departing the scope of claims of the present invention. The term "and/or" shall include the combination of a plurality of listed items or any of the plurality of listed items.

When one element is described as being "connected" or "accessed" to another element, it shall be construed as being connected or accessed to the other element directly but also as possibly having another element in between. On the other hand, if one element is described as being "directly connected" or "directly accessed" to another element, it shall be construed that there is no other element in between.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Unless otherwise defined, all terms, including technical terms and scientific terms, used herein have the same meaning as how they are generally understood by those of ordinary skill in the art to which the invention pertains. Any term that is defined in a general dictionary shall be construed to have the same meaning in the context of the relevant art, and, unless otherwise defined explicitly, shall not be interpreted to have an idealistic or excessively formalistic meaning.

Hereinafter, some embodiments of the present invention will be described in detail with reference to the accompanying drawings.

Figure 2:
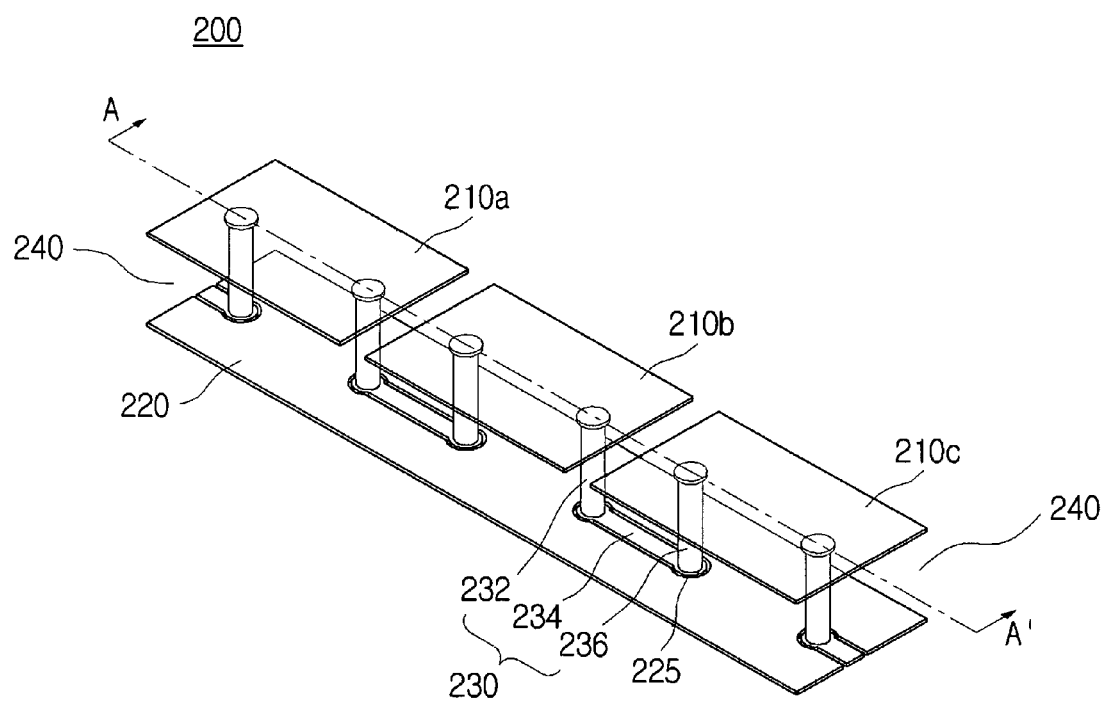
FIG. 2 is a 3-D perspective view showing an electromagnetic bandgap structure in accordance with an embodiment of the present invention.
Figure 3A:
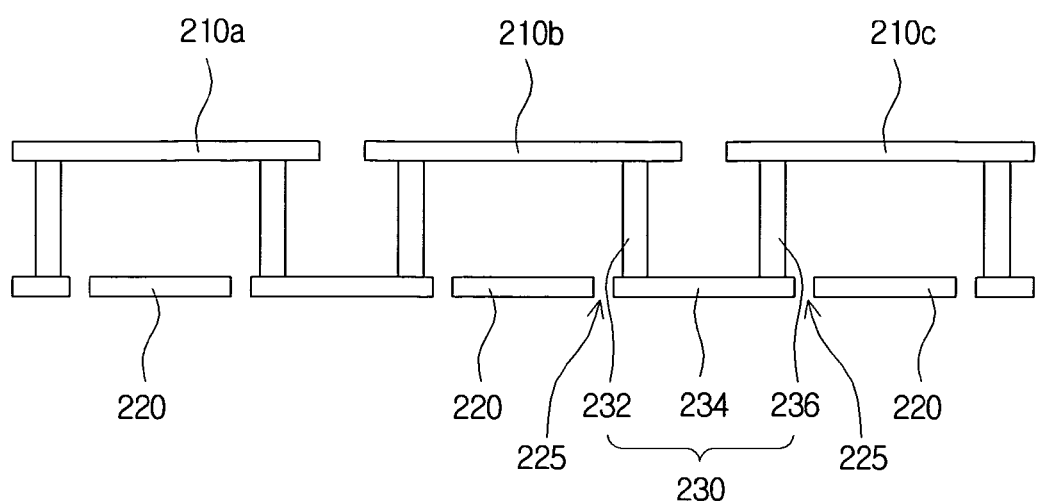
FIG. 3A is a sectional view showing the electromagnetic bandgap structure of FIG. 2.
Figure 3B:
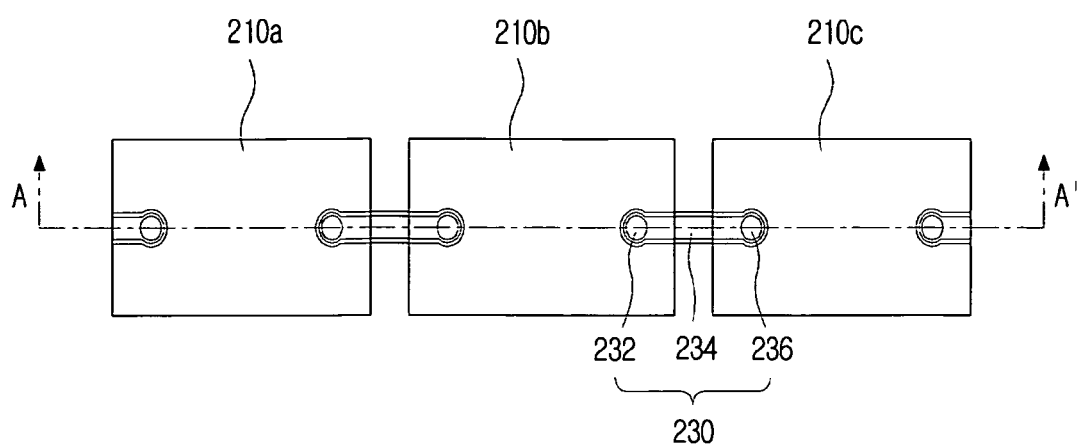
FIG. 3B is a plan view showing a configuration of the electromagnetic bandgap structure of FIG. 2.

FIG. 2 is a 3-D perspective view showing an electromagnetic bandgap structure in accordance with an embodiment of the present invention. FIG. 3A is a sectional view showing the electromagnetic bandgap structure of FIG. 2, and FIG. 3B is a plan view showing a configuration of the electromagnetic bandgap structure of FIG. 2. Particularly, FIG. 3A show a section viewed along the AA' line of FIG. 2.

Although a metal layer and a metal plate are used throughout the description of the structure of an electromagnetic bandgap of the present invention, it shall be evidently understood by any person of ordinary skill in the art that any other conductive layers and plates can be substituted for the metal layer and the metal plate.

As shown in FIG. 2 through FIG. 3B, the electromagnetic bandgap structure in accordance with an embodiment of the present invention can include a plurality of metal plates 210a, 210b and 210c, a metal layer 220 placed on a planar surface that is different from a planar surface in which the metal plates 210a, 210b and 210c are placed and a stitching via 230 electrically connecting two adjacent metal plates among the metal plates.

In other words, the electromagnetic bandgap structure 200 shown in FIG. 2 through FIG. 3B can basically include a two-layered planar structure having a first layer in which the metal layer 220 is placed and a second layer in which the plurality of metal plates 210 a, 210 b and 210 c are placed. A dielectric layer 240 can be interposed between the metal layer 220 and the plurality of metal plates 210 a, 210 b and 210 c.

Figure 3C:
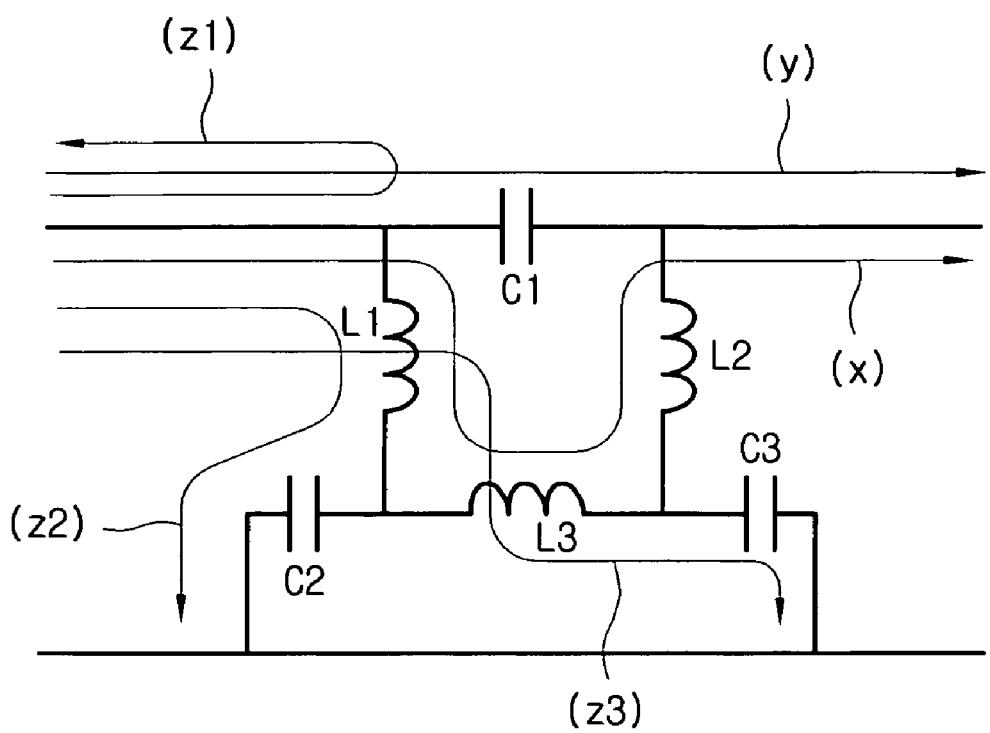
FIG. 3C shows an equivalent circuit of the electromagnetic bandgap structure of FIG. 2.
Figure 4A:
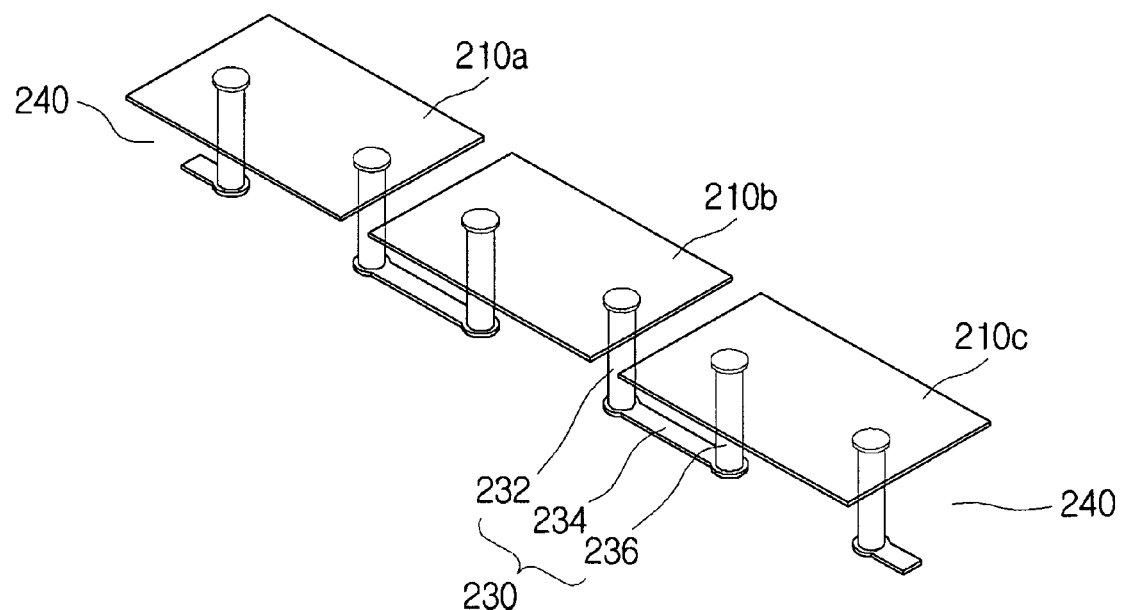
FIG. 4A is a 3-D perspective view showing an electromagnetic bandgap structure in accordance with another embodiment of the present invention.
Figure 4B:
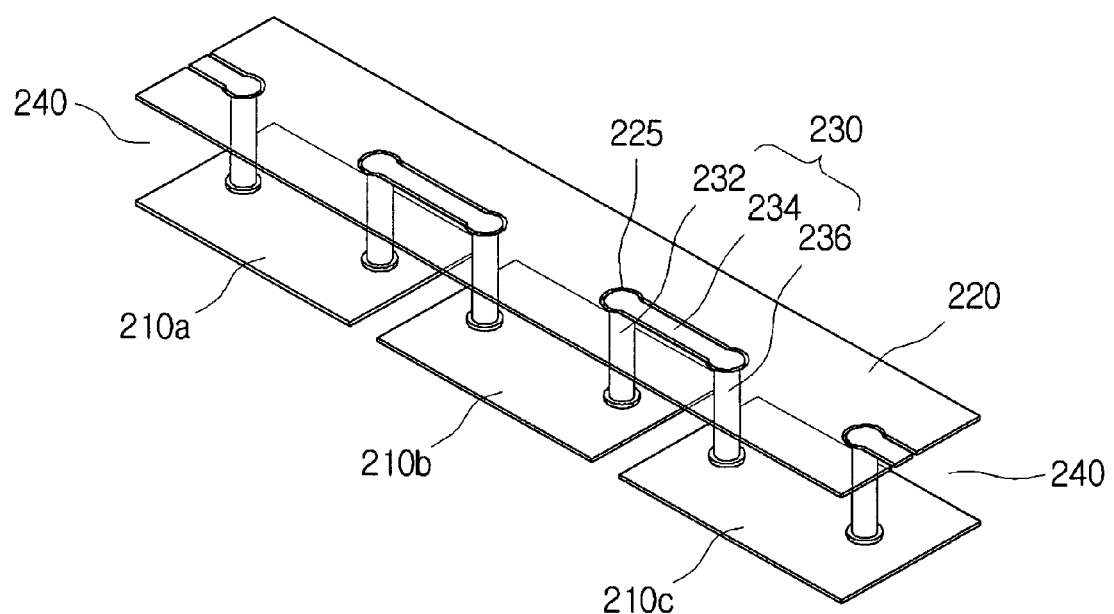
FIG. 4B is a 3-D perspective view showing an electromagnetic bandgap structure in accordance with another embodiment of the present invention.
Figure 4C:
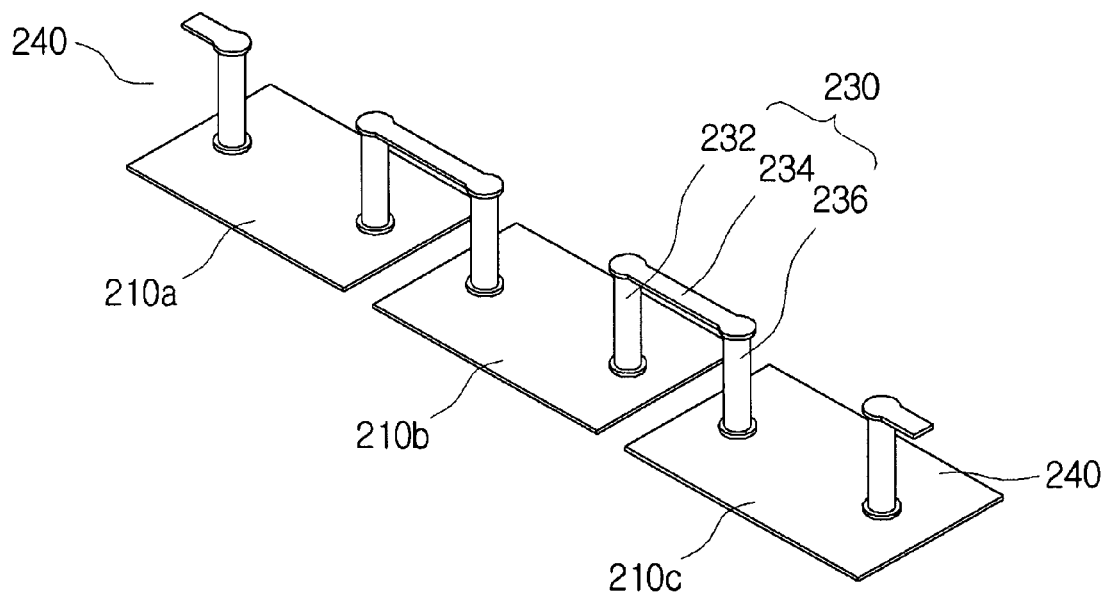
FIG. 4C is a 3-D perspective view showing an electromagnetic bandgap structure in accordance with another embodiment of the present invention.

Here, FIG. 2 through FIG. 3B merely show elements constituting the electromagnetic bandgap structure (i.e. a part constituting the 2-layered electromagnetic bandgap including the stitching via) for the convenience of illustration (also, in the case of FIG. 4A through FIG. 4C). Accordingly, the first layer in which the metal layer 220 shown in FIG. 2 through FIG. 3B is placed and the second layer in which the plurality of metal plates 210a, 210b and 210c shown in FIG. 2 through FIG. 3B are placed may be any two layers of a multi-layered printed circuit board.

In other words, it shall be obvious that there can be at least one additional metal layer below the metal layer 220, above the metal plates 210a, 210b and 210c and/or between the metal layer 220 and the metal plates 210a, 210b and 210c.

For example, the electromagnetic bandgap structure 200 shown in FIG. 2 through FIG. 3B can be placed between any two metal layers functioning as a power layer and a ground layer, respectively, in a multi-layered printed circuit board, in order to block a conductive noise (the same can be applied to electromagnetic bandgap structures shown in FIG. 4A to FIG. 4B in accordance with other embodiments of the present invention).

Since the conductive noise problem is not limited to the space between the power layer and the ground layer, the electromagnetic bandgap structure shown in FIG. 2 through FIG. 4C can be placed between any two ground layers or power layers placed on different layers from each other in a multi-layered printed circuit board.

The metal plates 210a, 210b and 210c can be spaced from each other at a predetermined distance on the same planar surface. Here, the metal layer 220 and the metal plates 210a, 210b and 210c can be a material (e.g. copper (Cu)) to which power can be supplied and a signal can be transmitted.

The stitching via 230 can electrically connect two adjacent metal plates (e.g. the metal plates 210b and 210c in FIG. 2). However, the two metal plates 210b and 210c are connected not on the same layer in which the metal plates 210b and 210c are placed but through another layer (e.g. the metal layer 220) that is different from the layer in which the metal plates 210b and 210c are placed.

The stitching via 230 can be formed to include a first via 232, a connection pattern 234 and a second via 236. The first via 232 can include one end part, connected to the first metal plate 210b, and the other end part, connected to one end part of the connection pattern 234. The second via 236 can include one end part, connected to the second metal plate 210c, and the other end part, connected to the other end part of the connection pattern 234. A via land for being connected to the first via 232 and/or the second via 236 can be formed on either end part of the connection pattern 234.

It shall be evident here that, in order to allow the metal plates to be electrically connected to each other, it is necessary that a plating layer be formed on an inner wall only of the first via 232 and the second via 236 of the stitching via 230 or the inside of the stitching via 230 be filled with a conductive material (e.g. conductive paste), and the connection pattern 234 be a conductive material such as a metal.

The two adjacent metal plates 210b and 210c can be connected in series through the stitching via 230. In particular, the two adjacent metal plates 210b and 210c can be electrically connected in series in the order of the first metal plate 210b→the stitching via 230 (the first via 232→the connection pattern 234→the second via 236)→the second metal plate 210b.

The first metal plate 210b can be connected to the other metal plate 210a through the stitching via 230. The second metal plate 210c can also be connected to another metal plate (not shown) through the stitching via 230. As a result, all metal plates, placed on the second layer, can be connected in series through the stitching via 230.

The metal layer 220 can be formed with a clearance hole 225 accommodating the connection pattern 234. The clearance hole 225 can also accommodate the via land for easy connection with the first via 232 and/or the second via 236 as well as the connection pattern 234. The clearance hole 225 can allow the stitching via 230 and the metal layer 220 to be electrically disconnected from each other.

Connecting the metal plates 210a, 210b and 210c through the stitching via 230 can make it unnecessary to form a pattern for connecting the metal plates 210a, 210b and 210c on the second layer. This can make the metal plates 210a, 210b and 210c smaller and the gap between the metal plates 210a, 210b and 210c narrower, increasing the capacitance in the gaps between the metal plates 210a, 210b and 210c.

FIG. 3C shows an equivalent circuit of an electromagnetic bandgap structure having the above structure.

Comparing the equivalent circuit of FIG. 3 with the electromagnetic bandgap structure of FIG. 2, an inductance component L1 can correspond to the fist via 232, and an inductance component L2 can correspond to the second via 236. An inductance component L3 can correspond to the connection pattern 234. C1 can be a capacitance component by the metal plates 210a and 210b and another dielectric layer and another metal layer to be placed above the metal plates 210a and 210b. C2 and C3 can be capacitance components by the metal layer 220 placed on the same planar surface as that of the connection pattern 234 and another dielectric layer and another metal layer to be placed below the planar surface of the connection pattern 234.

The electromagnetic bandgap structure shown in FIG. 2 through FIG. 3B can function as a band stop filter, which blocks a signal of a certain frequency band according to the above equivalent circuit. In other words, as seen in the equivalent circuit of FIG. 3, a signal x of a low frequency band (refer to FIG. 3C) and a signal y of a high frequency band (refer to FIG. 3C) can pass through the electromagnetic bandgap structure, and signals z1, z2 and z3 of a certain frequency band (refer to FIG. 3C) ranging between the low frequency band and the high frequency band are blocked by the electromagnetic bandgap structure.

In accordance with an embodiment of the present invention, the metal plates 210a, 210b and 210c can be placed on a planar surface in which another metal layer that is different from the metal layer 220 is placed. The metal plate 210a placed at a far left side, therefore, can be connected to the other metal layer that is different from the metal layer 220 through a stitching via, in accordance with the present invention.

If the metal layer 220 is a power layer, the different metal layer can be a ground layer, and if the metal layer 220 is a ground layer, the different metal layer can be a power layer.

Alternatively, a signal can be transferred in a predetermined direction by allowing the metal layer 220 to be the ground layer and the other metal layer to be a signal layer, and the noise of a certain frequency of the signal can be reduced by allowing the aforementioned metal plates 210a, 210b and 210c and the stitching via 230 to be arranged on some areas of a signal transfer path of the signal layer.

As shown in FIG. 2 through FIG. 3B, the metal plates 210a, 210b and 210c can be arranged in one row, and two stitching vias can be connected to each of the metal plates 210a, 210b and 210c. However, in accordance with another embodiment of the present invention, a metal plate can be arranged in a matrix of m×n, m and n being natural numbers, and its adjacent metal plates can be connected by using the stitching via. In this case, each metal plate can function as a path connecting its adjacent other metal plates and be connected to at least two stitching vias.

In other words, the connection form shown in FIG. 2 through FIG. 3B is merely an example, and as long as all metal plates can form a closed loop by being electrically connected to each other, any method of connecting the metal plates through the stitching via can be used. Hereinafter, various embodiments of the present invention according to the shape and arrangement of a metal plate will be described with the related drawings.

Figure 5:
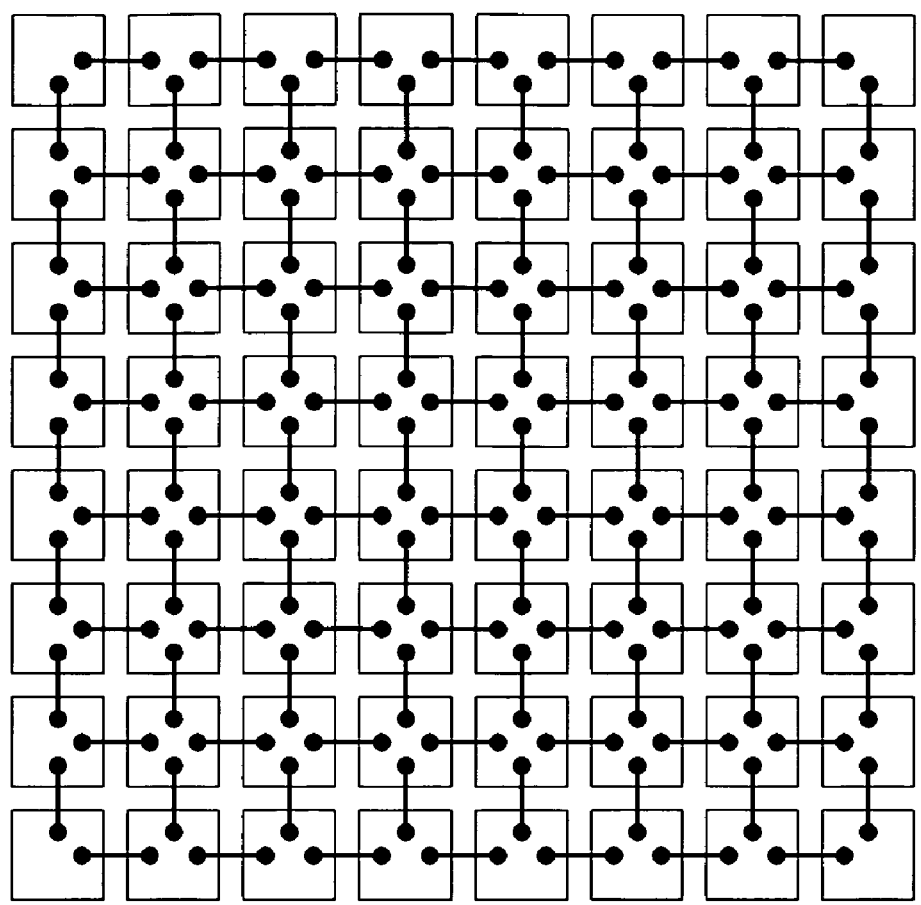
FIG. 5 is a plan view showing a configuration of an electromagnetic bandgap structure including a rectangular metal plate.
Figure 6:
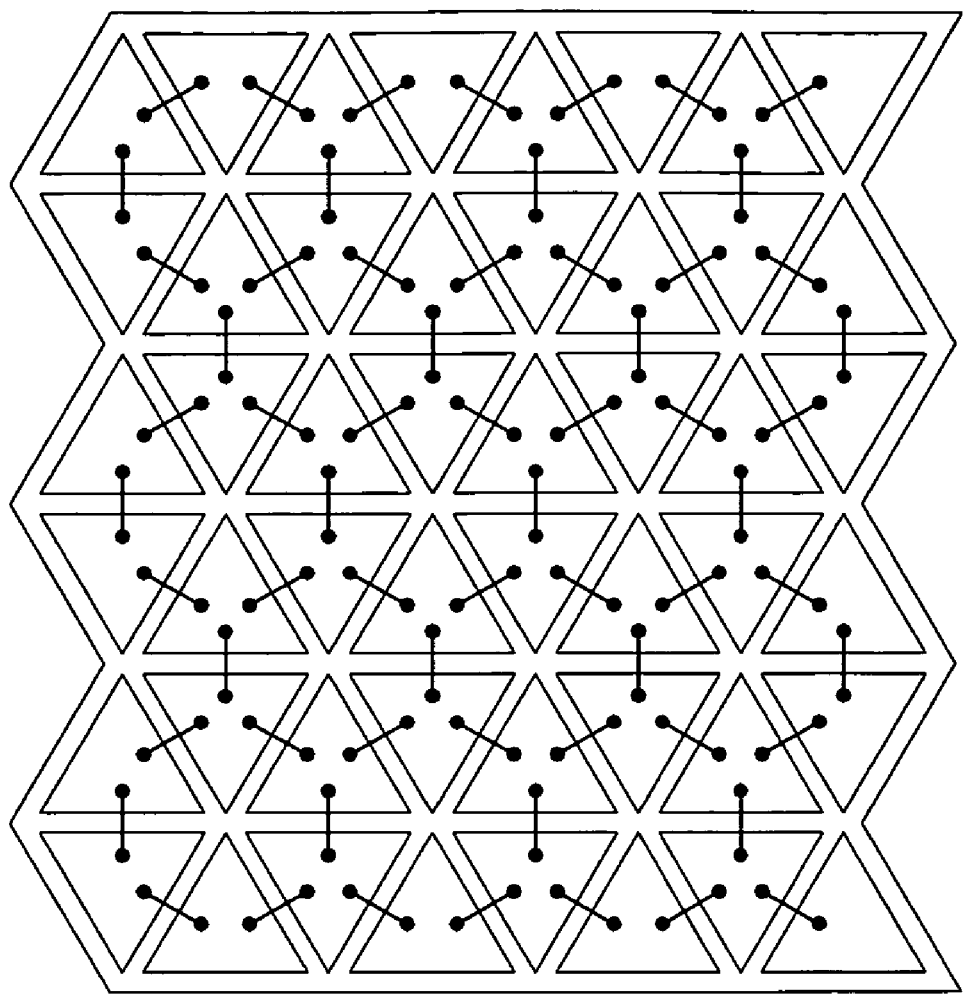
FIG. 6 is a plan view showing a configuration of an electromagnetic bandgap structure including a triangular metal plate.
Figure 7:
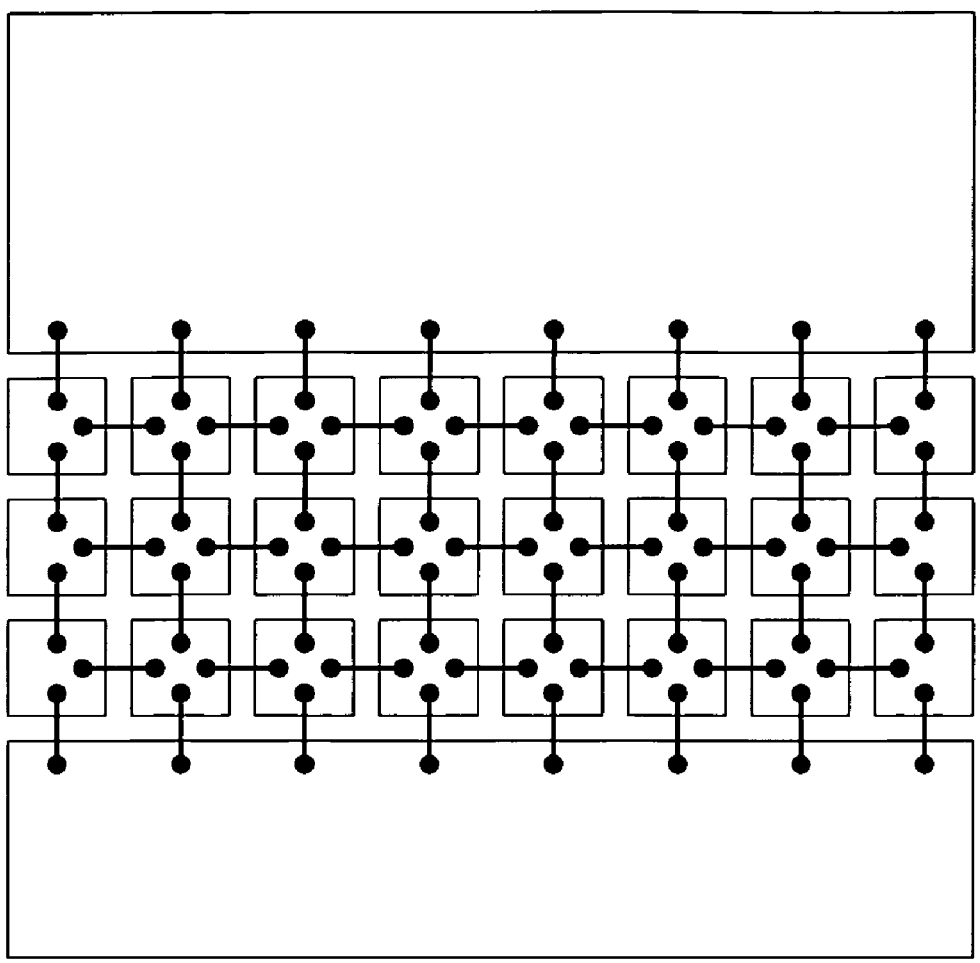
FIG. 7 is a plan view showing a band-shaped configuration of an electromagnetic bandgap structure.

FIG. 5 is a plan view showing a configuration of an electromagnetic bandgap structure including a rectangular metal plate, and FIG. 6 is a plan view showing a configuration of an electromagnetic bandgap structure including a triangular metal plate. FIG. 7 is a plan view showing a band-shaped configuration of an electromagnetic bandgap structure.

The metal plate can have a polygonal shape, such as a triangle (refer to FIG. 6) or a hexagon, or various other shapes, such as a circle or an ellipse, as well as a rectangle (refer to FIG. 5).

Moreover, the metal plates, which are connected through the stitching via, can be arranged on an entire board (refer to FIG. 5 and FIG. 6) or on a part of the board (refer to FIG. 7).

The metal plate can be connected to two adjacent different metal plates by being connected to two stitching vias, as described in FIG. 2, or four adjacent different metal plates by being connected to four stitching vias, as described in FIG. 5. Likewise, as described in FIG. 6, the metal plate can be connected to three adjacent different metal plates by being connected to three stitching vias.

In this case, the metal plates that are arranged in the path between a signal source and a signal destination are required not to be disconnected by the stitching via. In other words, the metal plates are arranged in two rows, and all adjacent metal plates of each metal plate can be connected by the stitching vias. Alternatively, each metal plate can be connected in a zigzag shape.

Figure 8:
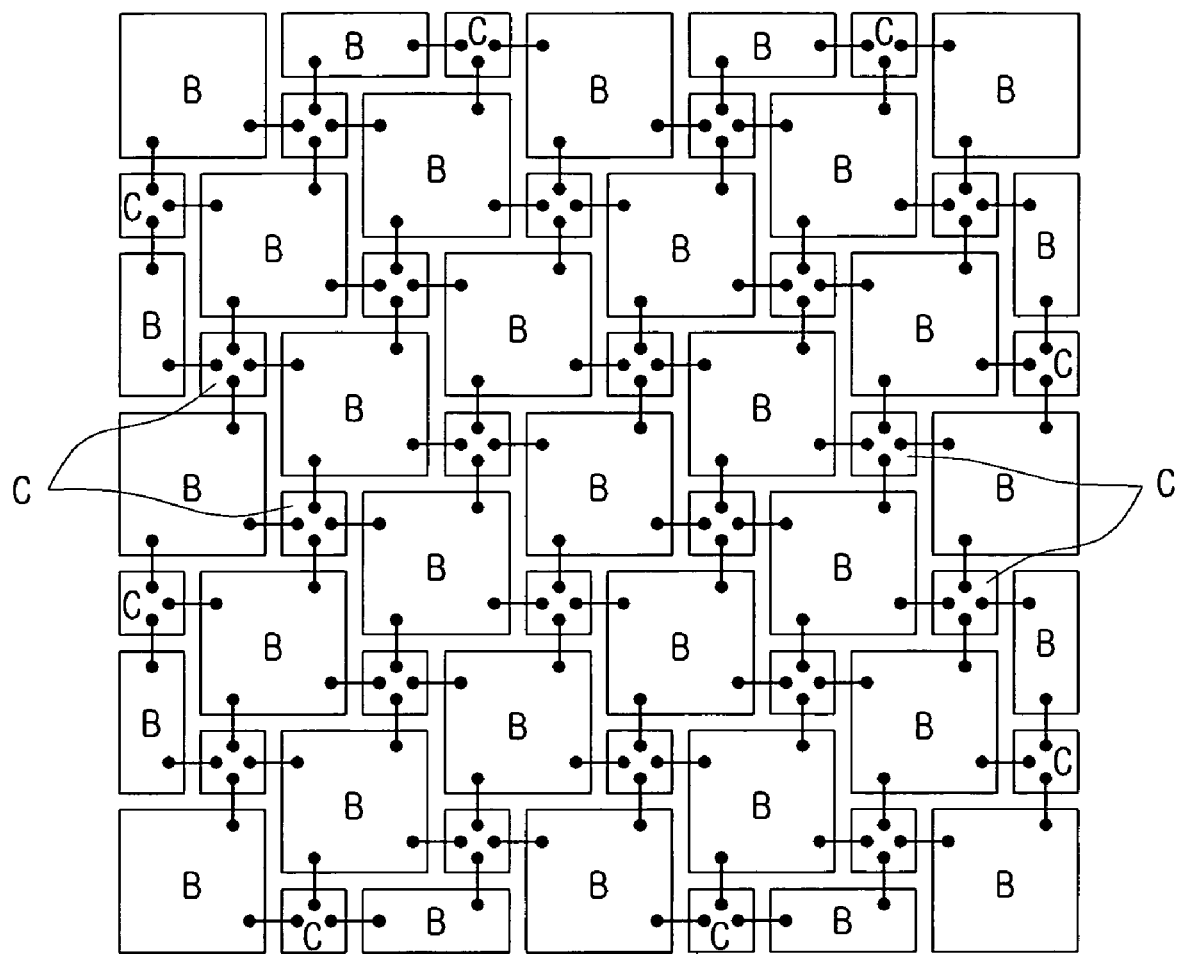
FIG. 8 and FIG. 9 are plan views showing a configuration of an electromagnetic bandgap structure including a plurality of groups having different sized metal plates.
Figure 9:
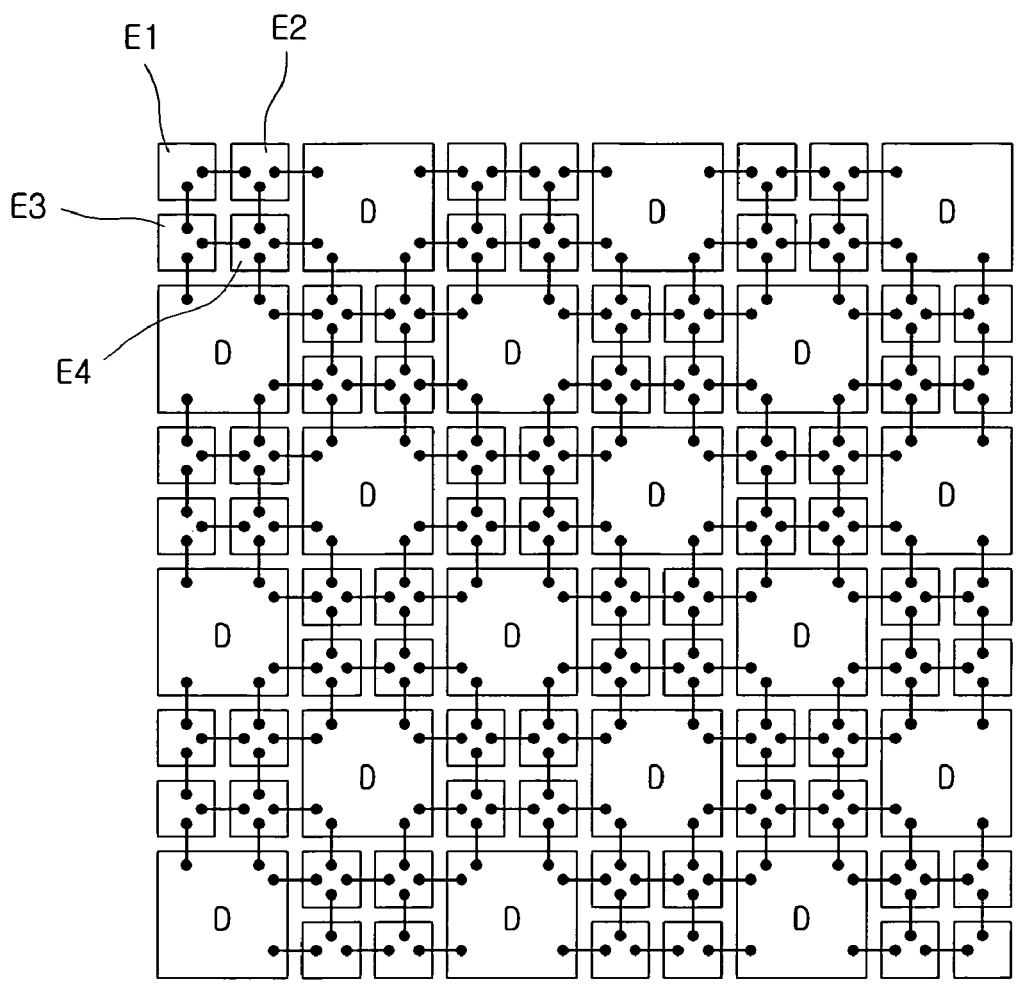

FIG. 8 and FIG. 9 are plan views showing a configuration of an electromagnetic bandgap structure including a plurality of groups having different sized metal plates.

All metal plates, connected through the stitching via, can have the same size, as described above, or different sizes, as illustrated in FIGS. 8 and 9. In other words, the metal plates can be distinguished into a plurality of groups having different sizes.

Referring to FIG. 8, metal plates B having a relatively bigger size and metal plates C having a relatively smaller size can be alternately arranged, and each metal plate can be connected to its adjacent metal plates, respectively, through the stitching vias. In other words, each of the large metal plates B and the small metal plates C can be connected to its adjacent metal plates C or B, respectively, by four stitching vias.

In the case of FIG. 9, metal plates D having a relatively bigger size and metal plates E1, E2, E3 and E4 having a relatively smaller size can be arranged. The small metal plates E1, E2, E3 and E4 can be grouped in a 2×2 form. Each group consisting of the 4 small metal plates E1, E2, E3 and E4 can occupy an area similar to the large metal plate D. Each of the small metal plates E1, E2, E3 and E4 can be connected to its adjacent metal plates, respectively, through 4 stitching vias. Also, since there are 8 small metal plates around the large metal plate D, the large metal plate D can be electrically connected to adjacent small metal plates through 8 stitching vias.

As described above, the arrangements combined with the differently sized metal plates can intercept the transfer of a signal corresponding to a certain frequency or decrease the corresponding noise.

Hereinafter, some electromagnetic bandgap structures in accordance with other embodiments of the present invention will be described in turn with reference to FIG. 4A through FIG. 4C. Any matter already described in FIG. 2 through FIG. 3B will be not redundantly described, and the electromagnetic bandgap structures will be briefly described based on the features of each embodiment of the present invention. This is because the same technological principle as described in FIG. 2 through FIG. 3B is applied to the electromagnetic bandgap structures of FIG. 4A through FIG. 4C in accordance with other embodiments of the present invention, except for some differences.

Accordingly, in FIG. 4A through FIG. 4C, each corresponding element is assigned the identical reference numeral as in FIG. 2 through FIG. 3B, for easy comparison.

As shown in FIG. 4A, the electromagnetic bandgap structure in accordance with another embodiment of the present invention can include a plurality of metal plates 210a, 210b and 210c and a stitching via 230 electrically connecting two adjacent metal plates of the metal plates 210a, 210b and 210c to each other. In other words, the electromagnetic bandgap structure of FIG. 4A does not have a metal layer corresponding to the metal layer 220 shown in FIG. 2 through FIG. 3A.

As such, it is not always necessary that the electromagnetic bandgap structure having a stitching via in accordance with an embodiment of the present invention include a metal layer below an area in which the stitching via and metal plates are placed. This is because it is not necessary that the connection pattern 234 of the stitching via 230 be formed on an area in which the metal layer is placed.

In other words, if there is a metal layer on the same planar surface to correspond to an area in which the connection pattern 234 will be placed, the connection pattern 234 can be manufactured in the form of being accommodated into the clearance hole 225 formed in the metal layer 220 on the same planar surface, as shown in FIG. 2 through FIG. 3B. However, no additional metal layer may be placed in the area in which the connection pattern 234 will be placed, as shown in FIG. 4A. Of course, there may be a dielectric layer 240 below the metal plates in FIG. 4A.

As shown in FIG. 4B, the electromagnetic bandgap structure in accordance with an embodiment of the present invention can have a stacked structure, with the position of the upper layer and the lower layer inversed from that of FIG. 2 through FIG. 3B.

In other words, while the electromagnetic bandgap structure shown in FIG. 2 through FIG. 3B has the metal layer 220 forming a lower layer, the metal plates 210 a, 210 b and 210 c forming an upper layer and the dielectric layer 240 interposed between the lower layer and the upper layer, the electromagnetic bandgap structure shown in FIG. 4B can inversely have the metal layer 220 forming the upper layer, the metal plates 210 a, 210 b and 210 c forming the lower layer and the dielectric layer 240 interposed between the lower layer and the upper layer. Of course, it can be expected that the electromagnetic bandgap structure shown in FIG. 4B has the identical or similar noise blocking effect to that of FIG. 2 through FIG. 3B.

As shown in FIG. 4C, the electromagnetic bandgap structure in accordance with another embodiment of the present invention can have the same structure of the electromagnetic bandgap structure shown in FIG. 4B without the metal layer 220. This reason, already described above with reference to FIG. 4A, will be omitted.

As such, the electromagnetic bandgap structure in accordance with the present invention can have various types of stacked structures. Although all of the foresaid drawings show that all metal plates are stacked in the same planar surface, it is not always necessary that all metal plates are stacked in the same planar surface.

In case at least one of the metal plates is stacked in a planar surface that is different from the planar surface in which the other metal plates are stacked, the electromagnetic bandgap structure will have two or more layers. However, this increased number of layers may have no disadvantageous effect on the design when the electromagnetic bandgap structure of the present invention is applied to a multi-layered printed circuit board.

The aforementioned drawings also show that each stitching via electrically connects two adjacent metal plates to each other. However, it may be unnecessary that two plates connected by the stitching via are adjacent to each other.

Even though one metal plate is shown to be connected to another metal plate through one stitching via, it is obviously unnecessary that the electromagnetic bandgap structure has any limitation to the number of the stitching vias connecting any two metal plates.

For the convenience of illustration and understanding of the invention, in FIG. 2 through FIG. 4C, only three metal plates are shown, and one metal plate is electrically connected to another adjacent metal plate and yet another adjacent metal plate through one stitching via each (i.e. two adjacent cells around one cell are connected).

In other words, the electromagnetic bandgap structure in accordance with each embodiment of the present invention can be arranged to have various shapes, sizes and configurations in some (particularly, refer to FIG. 7) or all parts of the board. This can be clearly understood by any person of ordinary skill in the art through the overall intent of the present invention.

Figure 10:
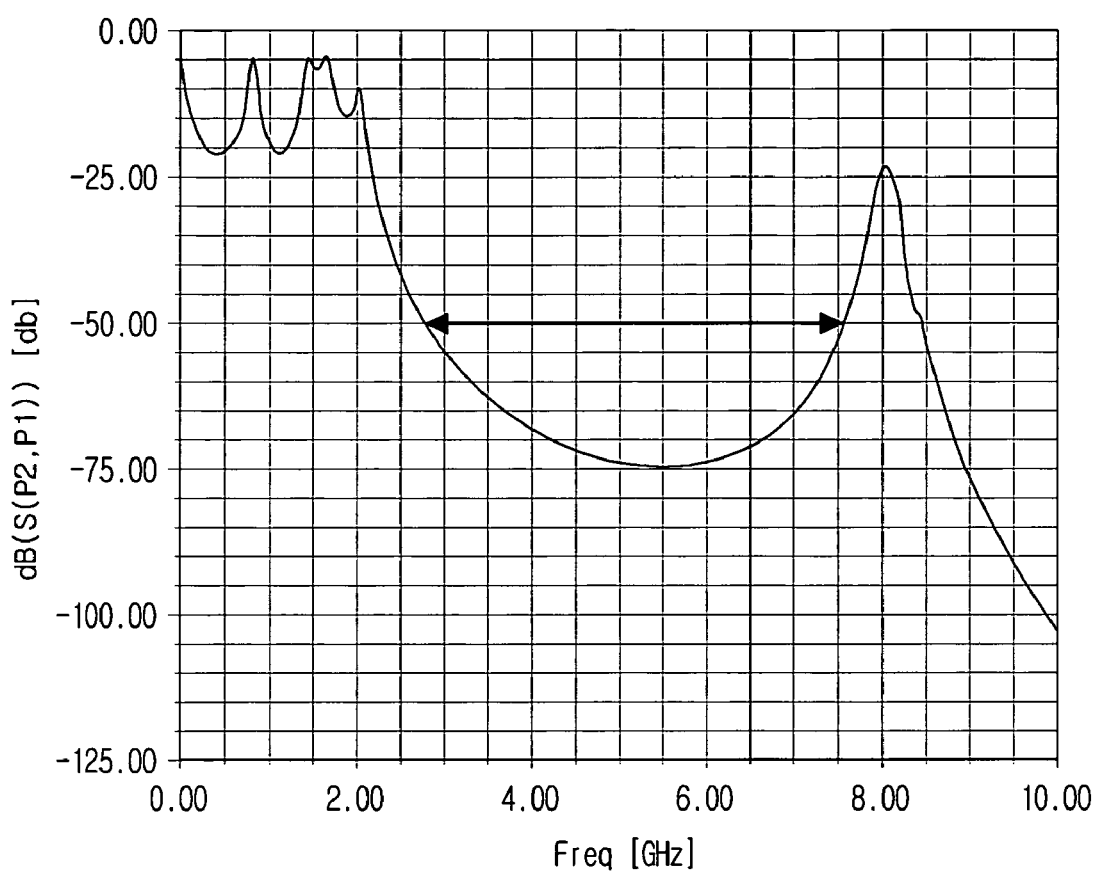
FIG. 10 is a graph showing a frequency property of an electromagnetic bandgap structure in accordance with an embodiment of the present invention.

FIG. 10 is a graph showing a frequency property of an electromagnetic bandgap structure in accordance with an embodiment of the present invention. FIG. 10 illustrates the result in which a simulation model is formed for the electromagnetic bandgap structure including the stitching via and then is analyzed by using scattering parameters.

On a −50 db basis, it can be recognized that a stop band, which intercepts a signal transferred through the electromagnetic bandgap structure, is formed in an area ranging the frequency band between about 2.8 and 7.5 GHz.

Of course, the frequency band of the stop band can be designed so as to have a desired frequency band by suitably adjusting various properties such as the size of the electromagnetic bandgap structure, the dielectric constant and configuration of the dielectric layer and the shape, size and number of the metal plate.

A printed circuit board in accordance with an embodiment of the present invention can be a system in package (SiP).

The printed circuit board can include a signal layer and a ground layer. A signal, transferred along the signal layer, may generate noise due to a high operation frequency. In this case, the forgoing electromagnetic bandgap structure can be applied to decrease the noise having a certain frequency.

The ground layer can be a metal layer, and the metal layers can be arranged to be spaced at regular intervals from each other on the same planar surface as the signal layer. Each metal plate can be connected through the stitching via. A first via and a second via of the stitching via can be connected to a connection pattern formed on the ground layer. The connection pattern can be accommodated into a clearance hole to be in no contact with the connection pattern.

The metal plates can be arranged along a signal transfer path in one row or two rows on the signal layer. Each of the metal plates can be connected through the stitching vias in order that a signal can be transferred from a signal source to a signal destination without disconnection.

In accordance with another embodiment of the present invention, the printed circuit board can include two electronic circuits (assumed to be a digital circuit and an analog circuit in this embodiment) having operation frequencies that are different from each other. At this time, the aforementioned electromagnetic bandgap structure can be arranged between the digital circuit and the analog circuit.

The electromagnetic bandgap structure can be particularly arranged in order that an electromagnetic wave transferred from the digital circuit to the analog circuit is required to pass through the electromagnetic bandgap structure. In this case, the electromagnetic bandgap structure can be arranged around the analog circuit and the digital circuit in a closed-loop shape. Alternatively, the electromagnetic bandgap structure can be arranged in some or all internal parts of the printed circuit board ranging from the digital circuit to the analog circuit.

The electromagnetic bandgap structure can be arranged between a power layer and a ground layer among the layers constituting the printed circuit board.

One of the ground layer and the power layer can be the metal layer. Also, the metal plates can be arranged away from each other at regular intervals on the same planar surface as the planar surface in which the other layer is arranged. Each of the metal plates can be connected through the stitching via. Here, a first via and a second via of the stitching via can be connected to a connection pattern formed in the metal layer. The connection pattern can be accommodated into a clearance hole to be in no contact with the metal layer.

As the aforementioned electromagnetic bandgap structure is arranged inside the printed circuit board having the digital circuit and the analog circuit, realized therein together, the printed circuit board can prevent an electromagnetic wave having a certain frequency band, among the electromagnetic waves, to be transferred from the digital circuit to the analog circuit, from being transferred.

In other words, despite the small size, it is possible to solve the foresaid mixed signal problem by restraining an electromagnetic wave ranging a certain frequency band, corresponding to noise in the analog circuit, from being transferred.

Although some embodiments of the present invention have been described, anyone of ordinary skill in the art to which the invention pertains should be able to understand that a very large number of permutations are possible without departing the spirit and scope of the present invention and its equivalents, which shall only be defined by the claims appended below.

What is claimed is:

1. An electromagnetic bandgap structure comprising: a dielectric layer; a plurality of conductive plates arranged two-dimensionally on a same planar surface of the dielectric layer; and a plurality of stitching vias, configured to electrically connect the conductive plates with one another and passing through the dielectric layer, a part of each of the stitching via being placed in a planar surface that is different from a planar surface in which the conductive plates are placed, wherein the conductive plates that are not placed in outermost areas of the two-dimensionally arranged conductive plates are respectively connected with at least three of the stitching vias connecting adjacent conductive plates among the conductive plates arranged two-dimensionally on a same planar surface; wherein the plurality of stitching vias comprises:
a first via, passing through the dielectric layer and having an end part being connected to any one of two adjacent conductive plates;
a second via, passing through the dielectric layer and having an end part being connected to the other of two adjacent conductive plates; and
a connection pattern, having one end part being connected to the other end part of the first via and the other end part being connected to the other end part of the second via; further comprising a conductive layer, wherein the dielectric layer is placed between the conductive plates and the conductive layer.

2. The electromagnetic bandgap structure of claim 1, wherein the conductive layer comprises a clearance hole, and the connection pattern is accommodated in the clearance hole.

3. The electromagnetic bandgap structure of claim 1, wherein the conductive plate has a polygonal, circular or elliptical shape.

4. The electromagnetic bandgap structure of claim 1, wherein the conductive plates have the same size.

5. The electromagnetic bandgap structure of claim 1, wherein the conductive plates are distinguished into a plurality of groups having different conductive plate sizes.

6. The electromagnetic bandgap structure of claim 1, wherein the conductive plates are placed on the same planar surface.

7. A printed circuit board comprising: two electronic circuits having different operation frequencies; and an electromagnetic bandgapstructure, configured to include a dielectric layer, a plurality of conductive plates arranged two-dimensionally on a same planar surface of the dielectric layer and a plurality of stitching vias electrically connecting the conductive plates with one another and arranged between the two electronic circuits, wherein the stitching vias pass through the dielectric layer, and a part of each of the stitching vias are placed in a planar surface that is different from a planar surface in which the conductive plates are placed, and the conductive plates that are not placed in outermost areas of the two-dimensionally arranged conductive plates are respectively connected with at least three of the stitching vias connecting adjacent conductive plates among the conductive plates arranged two-dimensionally on a same planar surface; wherein the plurality of stitching vias comprises: a first via, passing through the dielectric layer and having an end part being connected to any one of two adjacent conductive plates; a second via, passing through the dielectric layer and having an end part being connected to the other of two adjacent conductive plates; and
a connection pattern, having one end part being connected to the other end part of the first via and the other end part being connected to the other end part of the second via; further comprising a conductive layer, wherein the dielectric layer is placed between the conductive plates and the conductive layer.

8. The printed circuit board of claim 7, wherein the conductive layer comprises a clearance hole, and
the connection pattern is accommodated in the clearance hole.

9. The printed circuit board of claim 7, wherein the conductive layer is one of a ground layer and a power layer, and the conductive plates are connected on the same planar surface as a different layer.

10. The printed circuit board of claim 7, wherein the conductive plate has a polygonal, circular or elliptical shape.

11. The printed circuit board of claim 7, wherein the conductive plates have the same size.

12. The printed circuit board of claim 7, wherein the conductive plates are distinguished into a plurality of groups having different conductive plate sizes.

13. The printed circuit board of claim 7, wherein the conductive plates are placed on the same planar surface.

14. The printed circuit board of claim 9, wherein the conductive plates are connected to the different layer through the stitching via.

15. A printed circuit board comprising: a signal layer; a ground layer; and an electromagnetic bandgap structure, configured to include a dielectric layer, a plurality of conductive plates arranged two-dimensionally on a same planar surface of the dielectric layer and a plurality of stitching vias electrically connecting the conductive plates with one another, wherein the stitching vias pass through the dielectric layer, and a part of each of the stitching vias is placed in a planar surface that is different from a planar surface in which the conductive plates are placed, and the conductive plates are connected on a same planar surface as a planar surface in which the signal layer is placed, and the conductive plates that are not placed in outermost areas of the two-dimensionally arranged conductive plates are respectively connected with at least three of the stitching vias connecting adjacent conductive plates among the conductive plates arranged two-dimensionally on a same planar surface; wherein the plurality of stitching vias comprises:

a first via, passing through the dielectric layer and having an end part being connected to any one of two adjacent conductive plates;

a second via, passing through the dielectric layer and having an end part being connected to the other of two adjacent conductive plates; and a connection pattern, having one end part being connected to the other end part of the first via and the other end part being connected to the other end part of the second via; further comprising a conductive layer, wherein the dielectric layer is placed between the conductive plates and the conductive layer.

16. The printed circuit board of claim 15, wherein the conductive plates are connected to the signal layer through the plurality of stitching vias.

17. The printed circuit board of claim 15, wherein the conductive layer comprises a clearance hole, and the connection pattern is accommodated in the clearance hole.

18. The printed circuit board of claim 15, wherein the conductive layer is a ground layer.

19. The printed circuit board of claim 15, wherein the conductive plate has a polygonal, circular, or elliptical shape.

20. The printed circuit board of claim 15, wherein the conductive plates are arranged along a signal transfer path in one row or two rows.

21. The printed circuit board of claim 15, wherein the conductive plates have the same size.

22. The printed circuit board of claim 15, wherein the conductive plates are distinguished into a plurality of groups having different conductive plate sizes.

23. The printed circuit board of claim 15, wherein the conductive plates are placed on the same planar surface.

* * * * *

UNITED STATES PATENT AND TRADEMARK OFFICE
CERTIFICATE OF CORRECTION

PATENT NO.       : 8,310,840 B2  
APPLICATION NO.  : 12/222057  
DATED            : November 13, 2012  
INVENTOR(S)      : Han Kim et al.

It is certified that error appears in the above-identified patent and that said Letters Patent is hereby corrected as shown below:

Column 12, Line 34, In Claim 7, delete "bandgapstructure," and insert -- bandgap structure, --, therefor.

Signed and Sealed this  
Twelfth Day of March, 2013

Teresa Stanek Rea  
*Acting Director of the United States Patent and Trademark Office*